(12) United States Patent
Sunohara et al.

(10) Patent No.: US 8,212,365 B2
(45) Date of Patent: Jul. 3, 2012

(54) PRINTED WIRING BOARD AND MANUFACTURING METHOD THEREOF

(75) Inventors: Masahiro Sunohara, Nagano (JP); Keisuke Ueda, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 119 days.

(21) Appl. No.: 12/884,271

(22) Filed: Sep. 17, 2010

(65) Prior Publication Data

US 2011/0074046 A1 Mar. 31, 2011

(30) Foreign Application Priority Data

Sep. 25, 2009 (JP) ................................. 2009-221078

(51) Int. Cl.
 *H01L 29/40* (2006.01)
(52) U.S. Cl. ........ 257/778; 257/775; 257/776; 257/777; 257/686; 257/700; 257/729
(58) Field of Classification Search .................. 257/686, 257/700, 729, 775–778, E23.062, E23.063
See application file for complete search history.

(56) References Cited

U.S. PATENT DOCUMENTS

| | | | | |
|---|---|---|---|---|
| 4,888,247 A * | 12/1989 | Zweben et al. | ................ | 428/105 |
| 5,870,289 A * | 2/1999 | Tokuda et al. | ................ | 361/779 |
| 5,888,631 A * | 3/1999 | Sylvester | ...................... | 428/212 |
| 6,333,857 B1 * | 12/2001 | Kanbe et al. | ................... | 361/792 |
| 6,534,723 B1 * | 3/2003 | Asai et al. | ...................... | 174/255 |
| 6,896,405 B2 * | 5/2005 | Osone et al. | ..................... | 374/43 |
| 7,245,647 B2 * | 7/2007 | Jikutani et al. | ........... | 372/50.124 |
| 7,504,719 B2 * | 3/2009 | En et al. | ......................... | 257/700 |
| 7,619,316 B2 * | 11/2009 | Ueda et al. | ..................... | 257/777 |
| 7,851,359 B2 * | 12/2010 | Sunohara | ...................... | 438/667 |
| 7,859,121 B2 * | 12/2010 | Sunohara et al. | ............. | 257/778 |
| 7,882,626 B2 * | 2/2011 | Murayama et al. | ............. | 29/832 |
| 7,893,524 B2 * | 2/2011 | Sunohara et al. | ............. | 257/678 |
| 7,923,302 B2 * | 4/2011 | Ueda et al. | ..................... | 438/126 |
| 8,053,886 B2 * | 11/2011 | Taguchi et al. | ............... | 257/698 |
| 8,111,523 B2 * | 2/2012 | Sunohara et al. | ............. | 361/781 |
| 2002/0041489 A1 * | 4/2002 | Fritz | ............................. | 361/767 |
| 2005/0006744 A1 * | 1/2005 | Ooi et al. | ...................... | 257/686 |
| 2005/0155791 A1 * | 7/2005 | Saiki | .............................. | 174/262 |
| 2005/0272252 A1 * | 12/2005 | Usui et al. | ..................... | 438/624 |
| 2006/0093010 A1 * | 5/2006 | Sekiya et al. | ................... | 372/99 |

(Continued)

FOREIGN PATENT DOCUMENTS

JP 03-105954 5/1991

*Primary Examiner* — Allan R Wilson
*Assistant Examiner* — Mohammed Shamsuzzaman
(74) *Attorney, Agent, or Firm* — IPUSA, PLLC

(57) ABSTRACT

A printed wiring board is configured to be connected to an organic substrate in a state where a semiconductor chip is mounted thereon. A plurality of first layers are formed of a material having the same coefficient of thermal expansion as the semiconductor chip. A plurality of second layers are formed of a material having the same coefficient of thermal expansion as the organic substrate. The first layers have different thicknesses from each other and the second layers have different thicknesses from each other. The first layers and the second layers form a lamination by being laminated alternately one on another. The thicknesses of the first layers decrease from a side where the semiconductor chip is mounted toward a side where the organic substrate is connected. The thicknesses of the second layers decrease from the side where the organic substrate is connected toward the side where the semiconductor chip is mounted.

5 Claims, 16 Drawing Sheets

U.S. PATENT DOCUMENTS

| | | |
|---|---|---|
| 2006/0243478 A1* | 11/2006 | Inagaki et al. ............... 174/255 |
| 2006/0284304 A1* | 12/2006 | Caletka et al. ............... 257/700 |
| 2007/0057363 A1* | 3/2007 | Nakamura et al. ............ 257/698 |
| 2007/0121273 A1* | 5/2007 | Yamamoto et al. ......... 361/306.2 |
| 2008/0099888 A1* | 5/2008 | Kurihara et al. .............. 257/664 |
| 2008/0123073 A1* | 5/2008 | Shiraishi et al. ............... 355/67 |
| 2009/0301382 A1* | 12/2009 | Patel ............................ 116/201 |
| 2010/0066631 A1* | 3/2010 | Puzella et al. ................ 343/853 |
| 2010/0144091 A1* | 6/2010 | Kawano et al. .............. 438/107 |
| 2010/0155933 A1* | 6/2010 | Ooi et al. ..................... 257/700 |
| 2011/0132647 A1* | 6/2011 | Shang et al. ................. 174/258 |
| 2011/0157763 A1* | 6/2011 | Yamamoto et al. ........ 361/301.3 |
| 2012/0014641 A1* | 1/2012 | Maetani et al. ................ 385/14 |

* cited by examiner

US 8,212,365 B2

PRINTED WIRING BOARD AND MANUFACTURING METHOD THEREOF

CROSS-REFERENCE TO RELATED APPLICATIONS

This application is based upon and claims the benefit of priority of the prior Japanese Patent Application No. 2009-221078, filed on Sep. 25, 2009, the entire contents of which are incorporated herein by reference.

FIELD

The present invention relates to a printed wiring board to mount a semiconductor chip thereon.

BACKGROUND

A semiconductor device, which is formed by mounting a semiconductor chip on a printed wiring board having external connection terminals formed thereon, is used in many cases. Generally, such a printed wiring board is referred to as an interposer or a package substrate. Conventionally, a build-up wiring board is widely used as an interposer. The build-up wring board is a multi-layer wiring board having fine wires formed therein.

In recent years, with miniaturization of a semiconductor chip, a pitch of connection electrodes of the semiconductor chip has become decreased. However, the above-mentioned build-up wiring board has a limitation in a reduction in the size of wirings and a fine-pitch arrangement of connection electrodes. Thus, it has become difficult to mount a fine structure semiconductor chip onto the build-up wiring board. In order to eliminate such a problem, a silicon interposer has been developed. The silicon interposer enables formation of smaller wirings and connection electrodes than that of the build-up wiring board. The silicon interposer is a printed wiring board produced by forming fine wirings on a silicon substrate according to a silicon-fabrication technique. A fine wiring-structure, which is the same as a semiconductor chip formed by a silicon substrate, can be formed on the silicon interposer. The silicon substrate can be planarized further than an organic substrate such as a build-up wiring board. In this respect, it is said that a finer structure can be formed in the silicon interposer.

Furthermore, the silicon interposer has an advantage that there is no problem resulting from a thermal stress due to a mismatch of coefficients of thermal expansion because the silicon interposer is formed by a silicon substrate and the coefficient of thermal expansion of the silicon interposer is equal to the coefficient of thermal expansion of a silicon semiconductor chip, which is also formed by a silicon substrate. However, if a semiconductor device using a silicon interposer is mounted on a motherboard formed by an organic substrate, such as a build-up wiring board, a problem may occur due to a mismatch in coefficients of thermal expansion between the silicon interposer and the organic substrate of the motherboard. Especially, in a case of using a silicon interposer as large as more than 20 mm square size, a thermal stress due to a mismatch in coefficients of thermal expansion between the silicon interposer and the organic substrate, which may result in a failure in a temperature cycle test for determining a reliability of a connection between the silicon interposer and the organic substrate.

Here, Japanese Laid-Open Patent Application No. 3-105954 suggests forming an interposer by a material having a coefficient of thermal expansion between that of a semiconductor chip and that of an organic substrate in order to reduce a mismatch in coefficients of thermal expansion between the semiconductor chip, the interposer and the organic substrate.

According to the technique disclosed in the above-mentioned patent document, an interposer must be formed using a special material other than silicon in order to mount a semiconductor chip using a silicon substrate. Thus, a silicon interposer is not used in the technique disclosed in the above-mentioned patent document. An interposer of a material other than silicon is not generally used, and it is difficult to produce such an interposer and a manufacturing cost thereof is high.

Even if an interposer is formed by a material having a coefficient of thermal expansion between a semiconductor chip and an organic substrate, there still is a mismatch in the coefficient of thermal expansions between the interposer and the semiconductor chip and between the interposer and the organic substrate. Thus, there may be a problem caused by a thermal stress due to the mismatch in the coefficients of thermal expansion.

Moreover, because the silicon interposer is formed using a silicon substrate such as a silicon wafer, a number of silicon interposers, which can be formed in a single sheet of silicon wafer, is limited by a circular shape of the silicon wafer. For example, the maximum work size of an organic substrate, which can be handled presently, is a quadrangle form of 350 mm×510 mm, while the maximum work size of a silicon wafer, which can be handled and processed presently, is a circular form of 300 mm in diameter. If the silicon wafer having a diameter of 300 mm is used, the number of interposers, which can be formed in a single sheet of the silicon wafer, is smaller than that of a case where the quadrangular substrate of 350 mm×510 mm, thereby increasing a manufacturing cost of the silicon interposer.

SUMMARY

It is a general object of the present invention to provide a novel and improved printed wiring board which can eliminate the above-mentioned problems.

A more specific object of the present invention is to provide a printed wiring board (interposer) which can eliminate a mismatch in coefficients of thermal expansion between a semiconductor chip and a printed wiring board on which the semiconductor chip is mounted.

There is provided according to one aspect of the present invention a printed wiring board configured to be connected to an organic substrate in a state where a semiconductor chip is mounted on one surface of the printed wiring board and the other surface of the printed wiring board is connected to the organic substrate, the printed wiring board comprising: a plurality of first layers formed of a material having the same coefficient of thermal expansion as the semiconductor chip; and a plurality of second layers formed of a material having the same coefficient of thermal expansion as the organic substrate, wherein the first layers have different thicknesses from each other and the second layers have different thicknesses from each other; the first layers and the second layers form a lamination by being laminated alternately one layer on another layer; the thicknesses of the first layers decrease from a side where the semiconductor chip is mounted toward a side where the organic substrate is connected; and the thicknesses of the second layers decrease from the side where the organic substrate is connected toward the side where said semiconductor chip is mounted.

There is provided according to another aspect of the present invention a manufacturing method of a printed wiring board to be connected to an organic substrate in a state where a semiconductor chip is mounted on one surface of the printed wiring board and the other surface of the printed wiring board is connected to the organic substrate, the manufacturing method comprising: preparing an organic substrate core material including a concave portion having a bottom surface on which electrode wiring is formed; forming a lamination by alternately laminating a plurality of first layers having different thicknesses from each other and a plurality of second layers having different thicknesses from each other so that the thicknesses of the first layers decrease from a side where the semiconductor chip is mounted toward a side where the organic substrate is connected and the thicknesses of the second layers decrease from the side where the organic substrate is connected toward the side where the semiconductor chip is mounted; forming a first hole penetrating said lamination at a position corresponding to the electrode wiring of the organic substrate core material; forming a second hole penetrating an insulating resin filled in the first hole; and forming wiring on a surface of the insulating resin and connecting the wiring and the electrode wiring of the organic substrate core material by filling an electrically conductive material of the wiring into the second hole.

The object and advantages of the embodiment will be realized and attained by means of the elements and combinations particularly pointed out in the appended claims.

It is to be understood that both the foregoing general description and the following detailed description are exemplary and explanatory only and are not restrictive of the invention, as claimed.

DESCRIPTION OF EMBODIMENT(S)

Preferred embodiment of the present invention will be explained with reference to the accompanying drawings.

Figure 1:
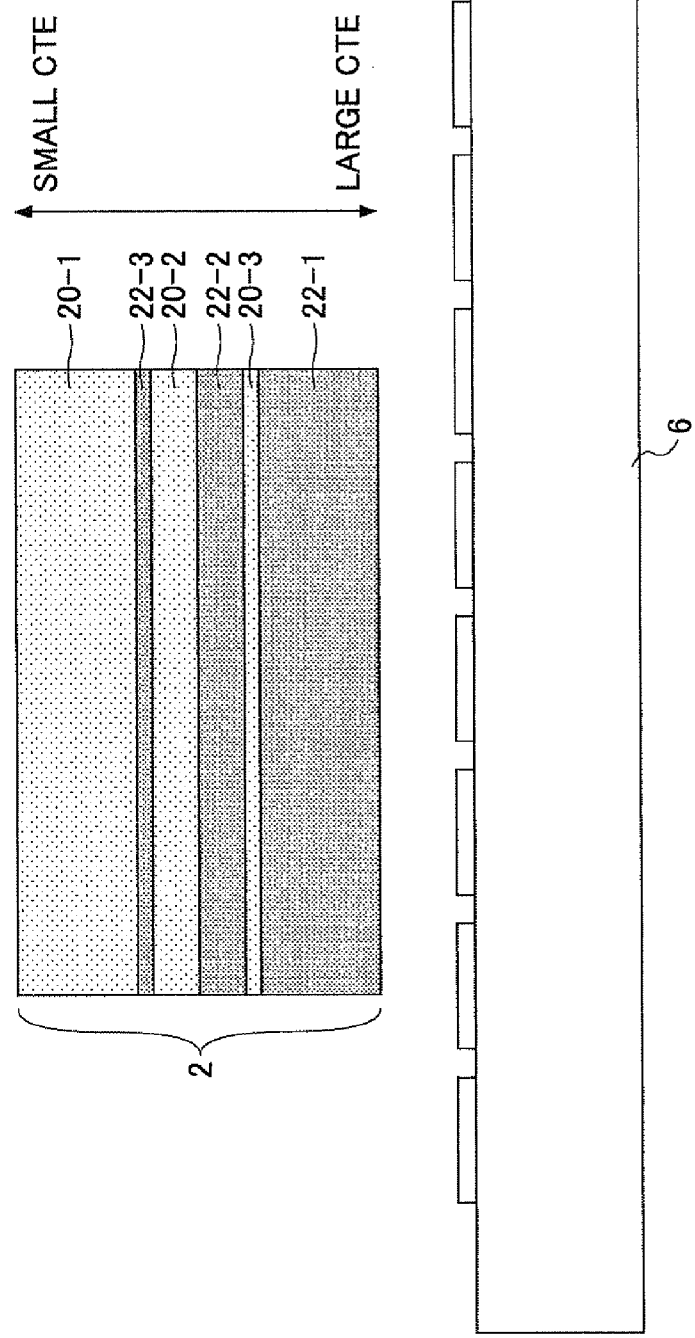
FIG. 1 is an illustration of a basic structure of a printed wiring board according to a first embodiment of the present invention.

A description will now be given, with reference to FIG. 1, of a basic structure of a printed wiring board according to a first embodiment of the present invention. FIG. 1 illustrates two layer structures of the printed wiring board 2 serving as an interposer. In FIG. 1, a semiconductor chip 4 is illustrated on the upper side of the printed wiring board 2, and an organic substrate or board 6 (hereinafter, referred to as organic substrate 6) as a motherboard is illustrated on the lower side of the printed wiring board 2. Only the layer structure of the printed wiring board 2 is illustrated in FIG. 1, and the entire structure of the printed wiring board 2 will be explained later.

The printed wiring board 2 according to the present embodiment includes a multilayer structure in which a plurality of silicon layers 20-1, 20-2 and 20-3 serving as first layers and a plurality of resin layers 22-1, 22-2 and 22-3 serving as second layers are stacked alternately one on another. Thicknesses of the silicon layers 20-1, 20-2 and 20-3 become smaller sequentially from the top (on the side of the semiconductor chip 4). On the other hand, thicknesses of the resin layers 22-1, 22-2 and 22-3 become smaller sequentially from the bottom (on the side of the organic substrate 6).

The silicon layers 20-1, 20-2 and 20-3 are formed of silicon, which is the same as the silicon of the semiconductor chip 4. Therefore, the coefficient of thermal expansion of the silicon layers 20-1, 20-2 and 20-3 is equal to the coefficient of thermal expansion of the semiconductor chip 4. On the other hand, the resin layers 22-1, 22-2 and 22-3 are formed of a resin material, which is the same resin material as the organic substrate 6. Therefore, the coefficient of thermal expansion of the resin layers 22-1, 22-2 and 22-3 is equal to the coefficient of thermal expansion of the organic substrate 6. Hereafter, a coefficient of thermal expansion is abbreviated as GTE.

Figure 2:
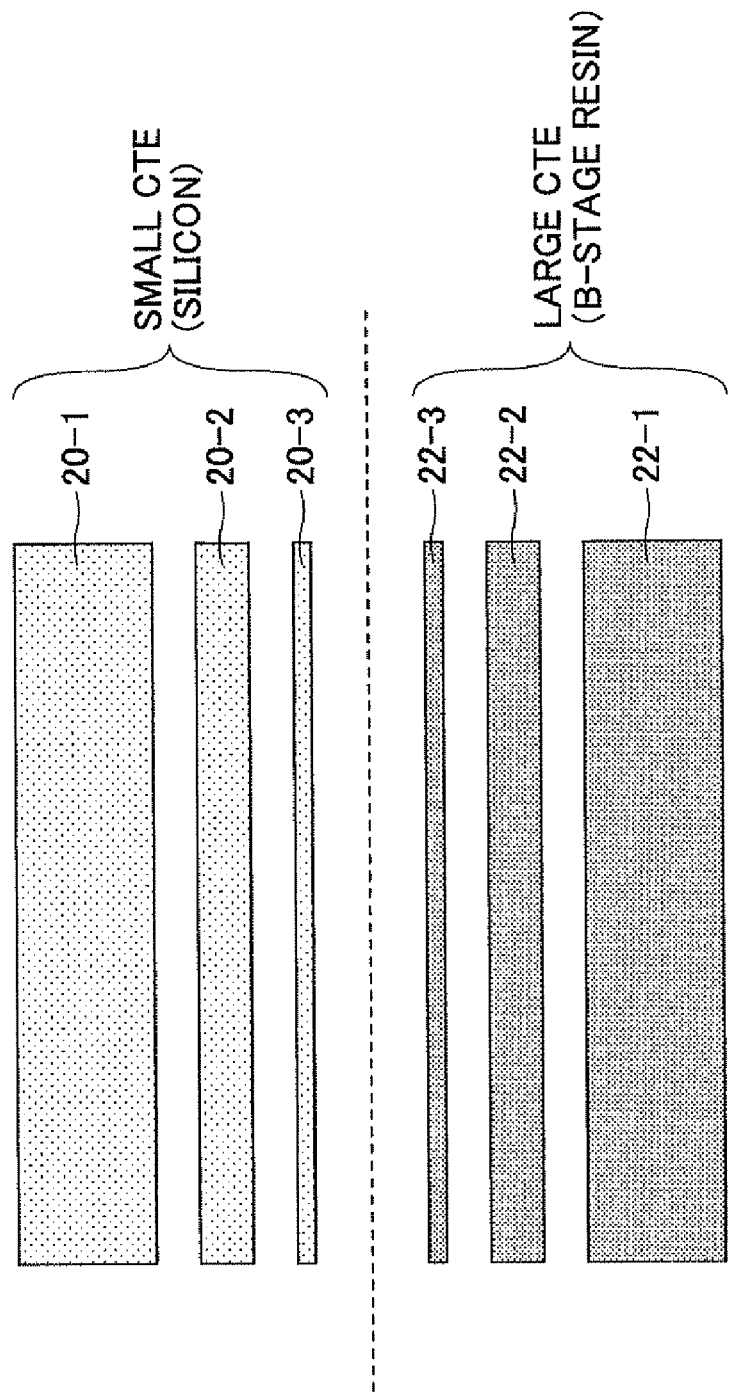
FIG. 2 is an illustration of silicon layers and resin layers illustrated in FIG. 1.

As illustrated in FIG. 2, the silicon layer 20-1 formed of silicon having a CTE smaller than the resin material is the thickest silicon layer, the silicon layer 20-2 is a second-thickest silicon layer, and the silicon layer 20-3 is a third-thickest silicon layer (the thinnest silicon layer). On the other hand, the resin layer 22-1 formed of a resin material having a CTE larger than the silicon is the thickest resin layer, the resin layer 22-2 is a second-thickest resin layer, and the resin layer 22-3 is a third-thickest resin layer (the thinnest resin layer).

In the lamination structure of the printed wiring board 2, the lowermost layer (layer nearest to the organic substrate 6) is the thickest resin layer 22-1, and the thinnest silicon layer 20-3 is laminated on the thickest resin layer 22-1. The second-thickest resin layer 22-2 is laminated on the thinnest silicon layer 20-3, and the second-thickest silicon layer 20-2 is laminated on the second-thickest resin layer 22-2. The thinnest resin layer 22-3 is laminated on the second-thickest silicon layer 20-2, and the thickest silicon layer 20-1 is laminated on the thinnest resin layer 22-3.

The silicon layer 20-1 is the uppermost layer, which is the nearest layer to the semiconductor chip 4. According to the above-mentioned lamination structure, the silicon layers become thinner gradually from the top, and the resin layers become thinner gradually from the bottom. Considering the entire thickness of the printed wiring board 2, it seems that the printed wiring board 2 is formed of a single composite material in which the content of silicon is larger on the side of the semiconductor chip 4 and the content of the resin material is larger on the side of the organic substrate 6.

According to the above-mentioned lamination structures, the portion near the organic substrate 6 from among portions of the printed wiring board 2 has a CTE equal to the CTE of the organic substrate 6 (CTE of the resin material), and the portion near the semiconductor chip 4 has a CTE equal to the semiconductor chip 4 (CTE of silicon). Then, when considering the entire thickness of the printed wiring board 20, in the middle portion between the portion near the organic substrate 6 and the portion near the semiconductor chip 4, the CTE is decreased from the portion near the organic substrate 6 toward the portion near the semiconductor chip 4.

Although the number of the silicon layers is 3 layers and the number of the resin layers is also 3 layers in the example illustrated in FIG. 1, the CTE of the printed wiring board 2 can be varied smoothly in the direction of thickness as the number of the laminated layers is larger, thereby dispersing and relaxing a thermal stress in the printed wiring board 2. However, considering the thicknesses of the silicon layers and the resin layers and considering processes to laminate the silicon layers and the resin layers, it is desirable to set the number of the silicon layers and the resin layers to 3-5 (three layers to five layers), respectively. That is, if the number of layers is large, the silicon layers and the resin layers cannot be made thin enough and a long time is spent on the laminating process, which results in a cost increase. Thus, it is desirable that the number of silicon layers and resin layers is equal to or smaller than 5 layers, respectively.

In the example illustrated in FIG. 1, the silicon layers 20-1, 20-2 and 20-3 are used on the assumption that the semiconductor chip 4 is formed of silicon. However, if the material of the semiconductor substrate forming the semiconductor chip 4 is a semiconductor material other than silicon, layers corresponding to the silicon layers may be formed by the semiconductor material of the semiconductor chip 4 or may be formed by an insulating material having a CTE equal to or close to the CTE of the semiconductor material of the semiconductor chip 4. As for such a material, for example, there are glass and ceramics. If, for example, the semiconductor material is gallium arsenide, gallium arsenide layers may be used instead of the silicon layers.

Although it is desirable to use the same resin material as the resin material forming the organic substrate 6 to which the printed wiring board 2 is connected, any insulating material having a CTE equal to or close to the CTE of the organic substrate 6 can be used. As for such a resin material, there are build-up resins such as, for example, an epoxy resin, a polyimide resin and a silicone resin. It is desirable that the resin material used as the resin layers is a half-curable resin (generally referred to as a B-stage resin). The reason for using the B-stage resin is to place the resin layer on the silicon layer while the resin material is a sheet of a half-cured state and to cause the resin material to adhere to the silicon layer when being cured.

According to the printed wiring board 2 having the above-mentioned lamination structure, a thermal stress, which is generated due to the difference in CTE between the semiconductor chip 4 and the organic substrate 6, is not generated between the semiconductor chip 4 and the printed wiring board 2 and between the organic substrate 6 and the printed wiring board 2 but generated in the interior of the printed wiring board 2 and relaxed in the printed wiring board 2. Thus, there is no thermal stress generated in the connection part between the semiconductor chip 4 and the printed wiring board 2 and the connection part between the organic substrate 6 and the wiring board 6. Accordingly, a connection failure can be prevented from being occurred between the semiconductor chip 4 and the printed wiring board 2 and between the organic substrate 6 and the printed wiring board 2. Thereby, the semiconductor device formed by mounting the semiconductor chip 4 onto the printed wiring board 2 is improved in its reliability, and the semiconductor device can clear a temperature cycle test. Moreover, a mounting reliability can be acquired when the semiconductor device formed by mounting the semiconductor chip 4 on the printed wiring board 2 is mounted to the organic substrate 6 (motherboard).

Although it is illustrated in the above-mentioned example that only the semiconductor chip 4 is mounted on the printed wiring board 2, a plurality of semiconductor chips may be mounted on the printed wiring board 2.

A description is given below of a manufacturing method of the printed wiring board 2. In the above explanation, it is mentioned that the printed wiring board 2 corresponds to an interposer and the organic substrate 6 corresponds to a motherboard. However, it is assumed that the printed wiring board 2 explained below has an organic substrate core material containing an organic material, and the above-mentioned lamination structure is formed on the organic substrate core material. In this case, it can be interpreted that the organic substrate core material corresponds to the above-mentioned organic substrate 6.

Figure 3:
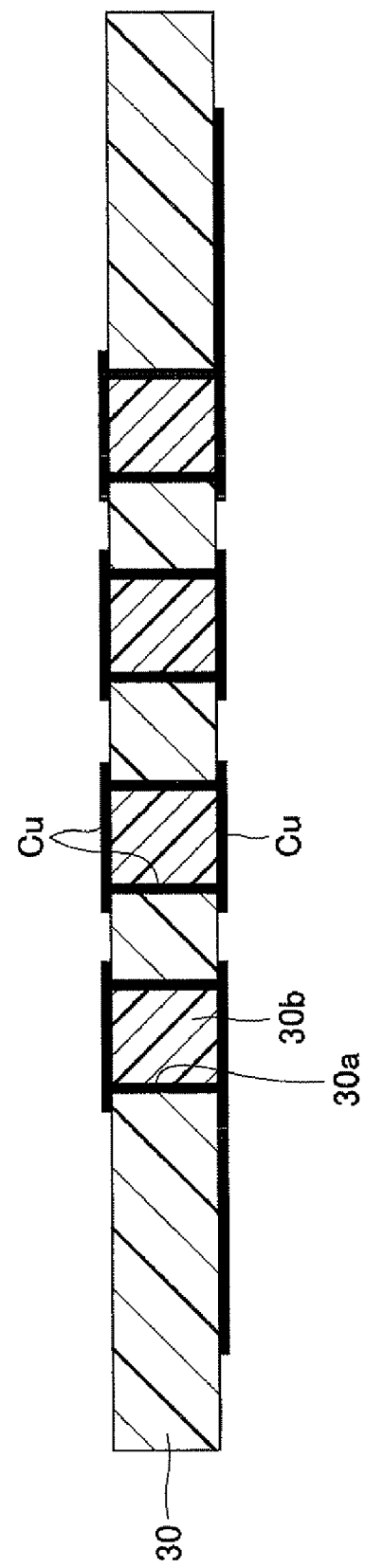
FIG. 3 is a cross-sectional view of a glass cloth core.

In order to manufacture the printed wiring board 2, as illustrated in FIG. 3, a glass cloth core 30 having Cu wirings on both sides thereof is prepared first. The glass cloth core 30 is an organic substrate core material. A so-called glass-epoxy board, which is formed by impregnating an epoxy resin into a glass cloth, may be used as the glass cloth core 30. The Cu wirings formed on both sides of the glass cloth core 30 are connected with each other by copper films formed on inner surfaces of penetrating holes 30a. An epoxy resin 30b is filled in each of the penetrating holes 30a.

Figure 4:
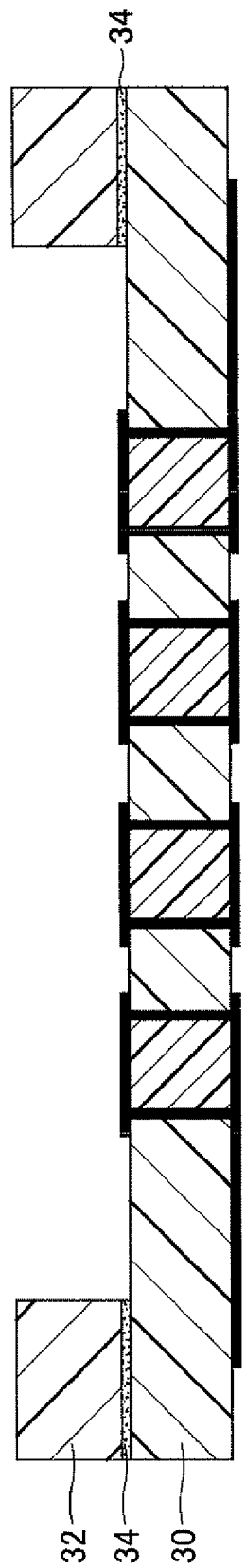
FIG. 4 is a cross-sectional view illustrating a state where a frame-like glass cloth core is joined to the glass cloth core.

Then, as illustrated in FIG. 4, a frame-like glass cloth core 32 is applied to the glass cloth core 30 by an adhesive 34 such as an epoxy resin or a polyimide resin. The frame-like glass cloth core 32 forms a concave portion 32a for forming the printed wiring board 2 as mentioned later. A surface of the glass cloth core 30 and the Cu wirings are exposed on the bottom of the concave portion 32a. The curing temperature of the adhesive 34 is, for example, 200° C. when an epoxy resin is used, and 350° C. when a polyimide resin is used.

Figure 5:
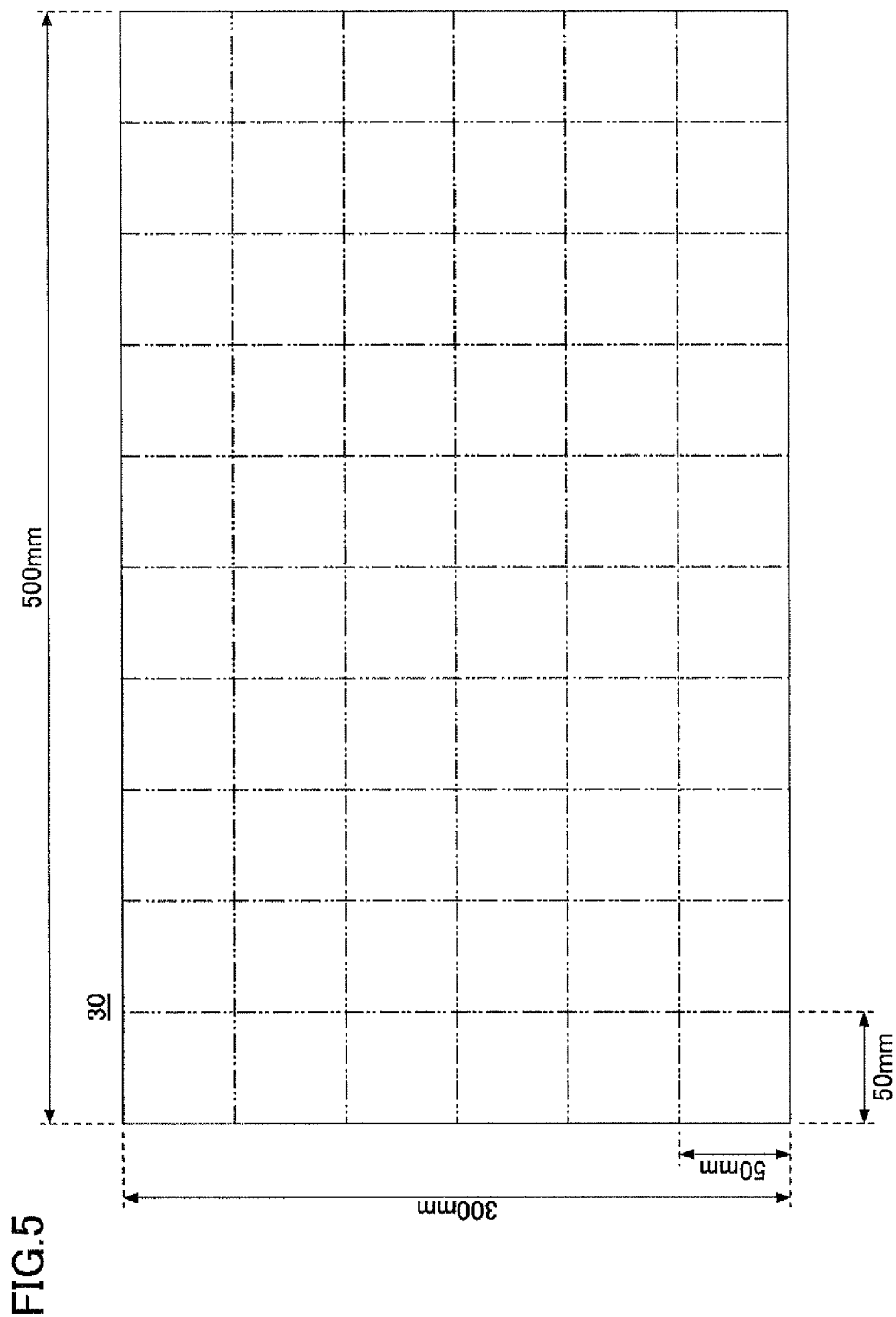
FIG. 5 is a plan view of the glass cloth core.
Figure 6:
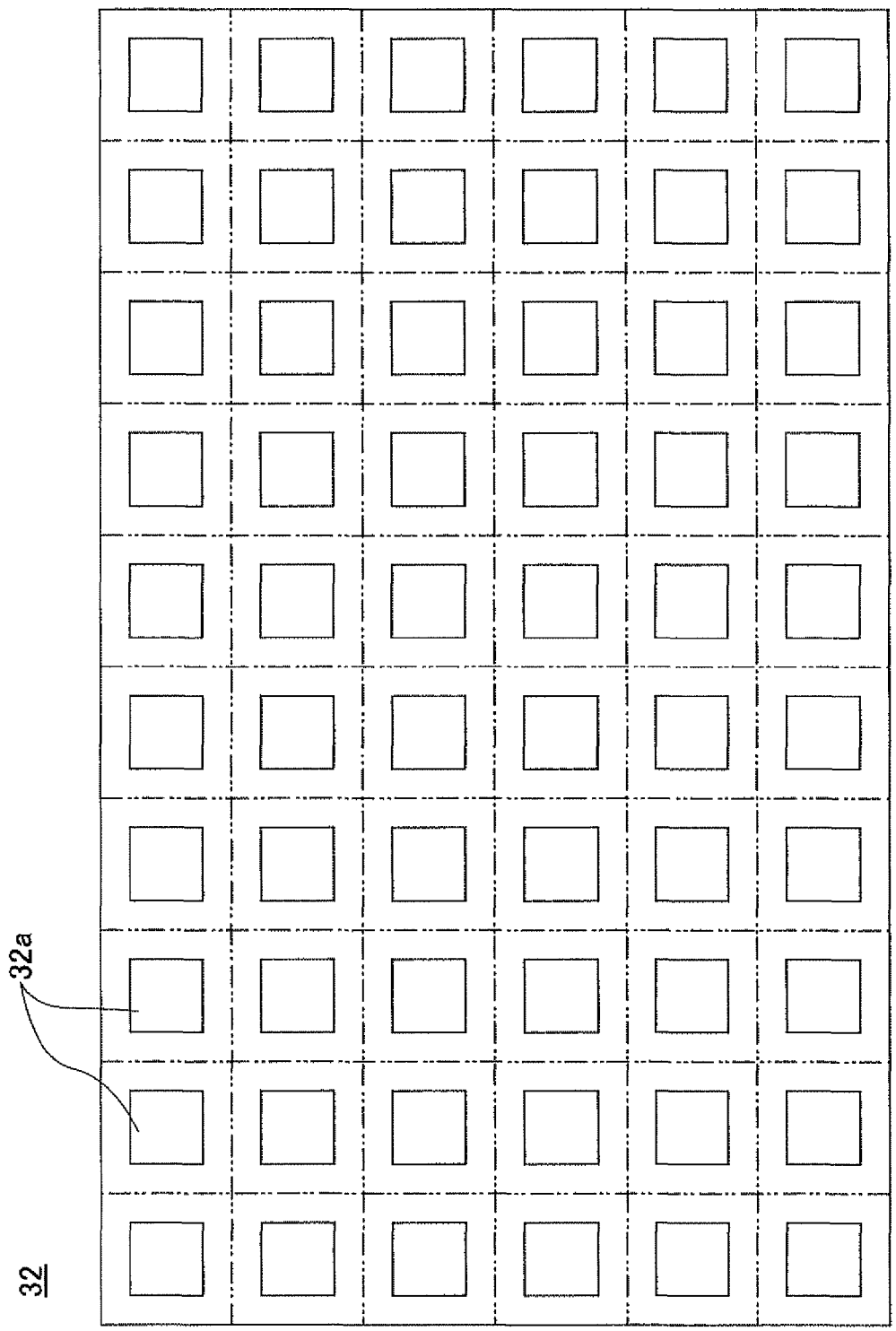
FIG. 6 is a plan view of the frame-like glass cloth core.

The glass cloth core 30 and the frame-like glass cloth core 32 illustrated in FIG. 4 are portions that form a single sheet of the printed wiring board 2. Actually, a plurality of sheets of the printed wiring boards 2 are formed by one sheet of the glass cloth core 30 and one sheet of the glass cloth core 32. For example, when the size of the printed wiring board 2 is 50 mm square, by setting the glass cloth core 30 to the size of 300 mm×500 mm as illustrated in FIG. 5, 6×10=60 sheets of the printed wiring board 2 can be formed from one sheet of the glass cloth core 30. In this case, the frame-like glass cloth core 32 must have 60 pieces of the concave portion 32a as illustrated in FIG. 6 (the concave portions 32a are through openings in the glass cloth core 32 alone). In FIG. 5 and FIG. 6, double-dashed chain lines indicate boundaries of the printed wiring boards 2. By cutting the glass cloth core 30 finally at the boundaries, the board formed by a plurality of printed wiring boards 2 connected with each other is divided into a plurality of individual printed wiring boards 2.

Figure 7:
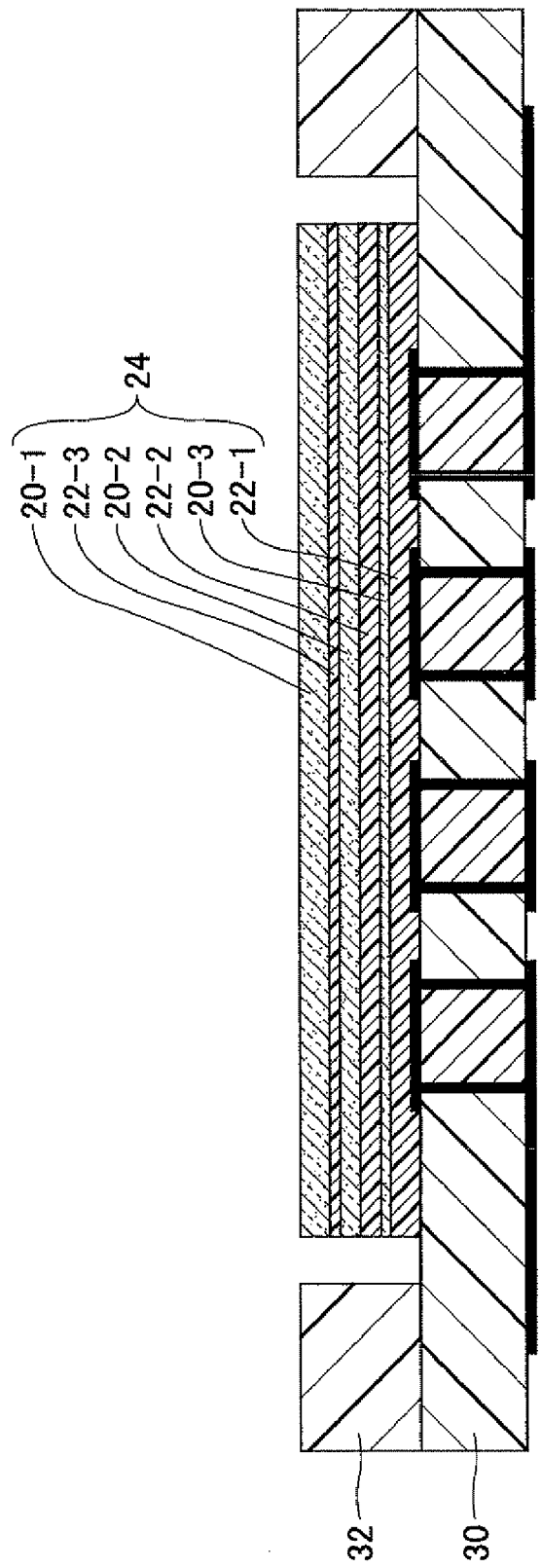
FIG. 7 is a cross-sectional view illustrating a state where a lamination is formed by stacking the silicon layers and the resin layers on the glass cloth core.

After curing the adhesive 34 to join the glass cloth core 32, as illustrated in FIG. 7, it proceeds to a laminating process to laminate the silicon layers 20-1, 20-2 and 20-3 and the resin layers 22-1, 22-2 and 22-3. Each of the silicon layers 20-1, 20-2 and 20-3 and the resin layers 22-1, 22-2 and 22-3 is formed as a sheet or a film having a size smaller than the concave portion 32a.

First, the thickest resin layer 22-1 is arranged on the surface of the glass cloth core 30 on the bottom of each of the concave portions 32a. The resin layer 22-1 is made of the same resin as the epoxy resin of the glass cloth core 30 or a half-curable resin film having a CTE of the same level. The thickness of the resin layer 22-1 is, for example, 60 μm. The resin layer 22-1 is heated (for example, at 100° C.) and set to a half-cured state. Then, the thinnest silicon layer 20-3 is arranged on the resin layer 22-1 of the half-cured state. The silicon layer 20-3 is a silicon film having a thickness of, for example, 20 μm, which is formed by grinding a silicon material. Because the resin layer 22-1 of the half-cured state has an adherence property, the silicon layer 20-3 is adhered and fixed on the resin layer 22-1.

Then, the second-thickest resin layer 22-2 is arranged on the silicon layer 20-3. The resin layer 22-2 is made of the same resin as the epoxy resin of the glass cloth core 30 or a half-curable resin film having a CTE of the same level. The thickness of the resin layer 22-2 is, for example, 40 μm. The resin layer 22-2 is heated and set to a half-cured state. Then, the second-thickest silicon layer 20-2 is arranged on the resin layer 22-2 of the half-cured state. The silicon layer 20-2 is a silicon film having a thickness of, for example, 40 μm, which is formed by grinding a silicon material. Because the resin layer 22-2 of the half-cured state has an adherence property, the silicon layer 20-2 is adhered and fixed on the resin layer 22-2.

Then, the thinnest resin layer 22-3 is arranged on the silicon layer 20-2. The resin layer 22-3 is made of the same resin as the epoxy resin of the glass cloth core 30 or a half-curable resin film having a CTE of the same level. The thickness of the resin layer 22-3 is, for example, 20 μm. The resin layer 22-3 is heated and set to a half-cured state. Then, the thickest silicon layer 20-1 is arranged on the resin layer 22-3 of the half-cured state. The silicon layer 20-1 is a silicon film having a thickness of, for example, 60 μm, which is formed by grinding a silicon material. Because the resin layer 22-3 of the half-cured state has an adherence property, the silicon layer 20-1 is adhered and fixed on the resin layer 22-3.

Figure 8:
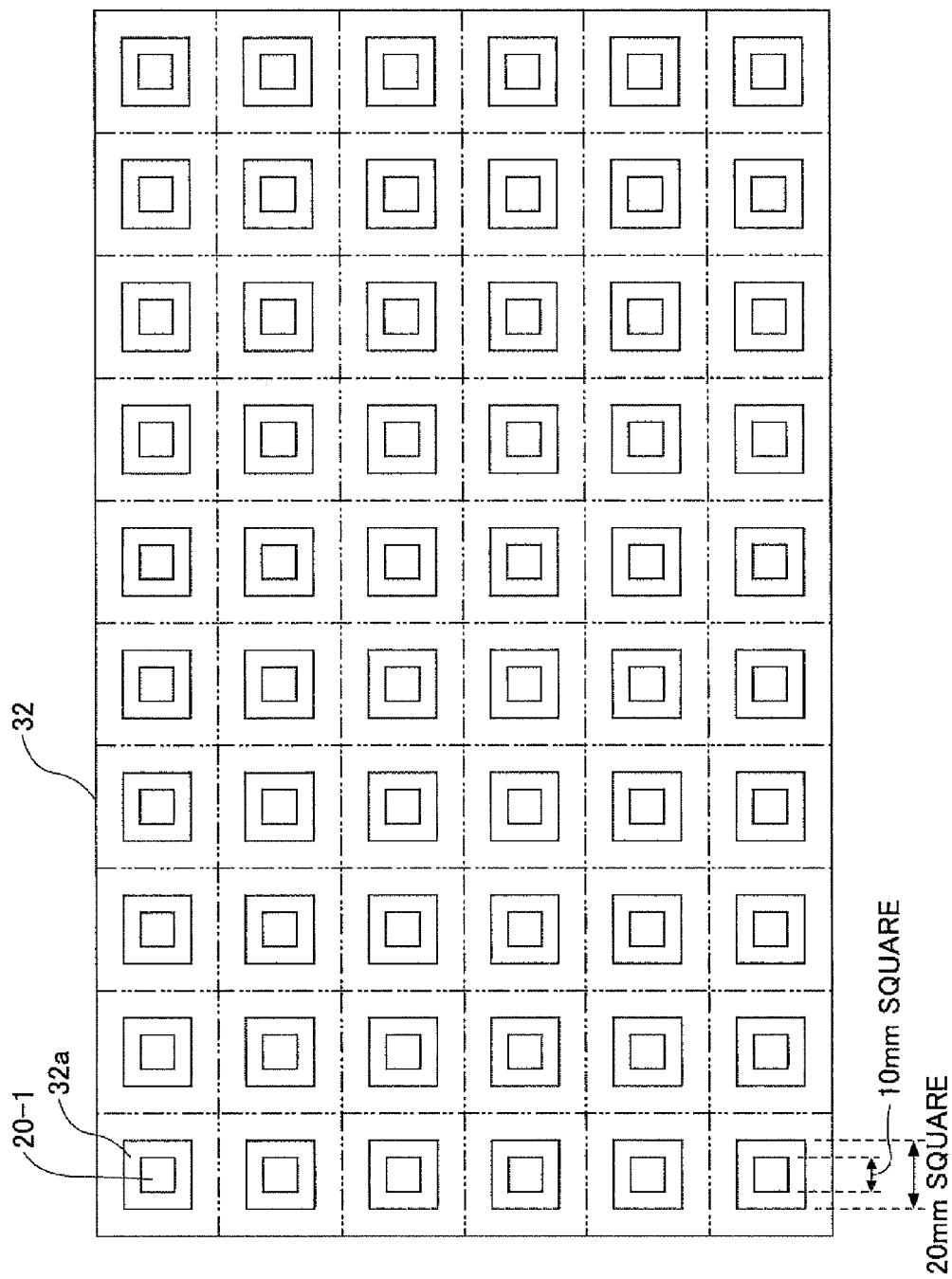
FIG. 8 is a plan view of the entire glass cloth core illustrated in FIG. 7.

The thickness of the lamination 24 of the silicon layers and the resin layers is equal to the depth of the concave portion 32a of the frame-like glass cloth core 32. That is, the thickness of the glass cloth core 32 is previously set to be equal to the thickness of the lamination 24. A state where the laminations 24 of the silicon layers and the resin layers are formed in the concave portions 32a of the glass cloth core 32 is illustrated in FIG. 8. For example, the size of each of the concave portions 32a is 20 mm square, and the size of each of the silicon layers 20-1, 20-2 and 20-3 and the resin layers 22-1, 22-2 and 22-3 is 10 mm square.

Figure 9:
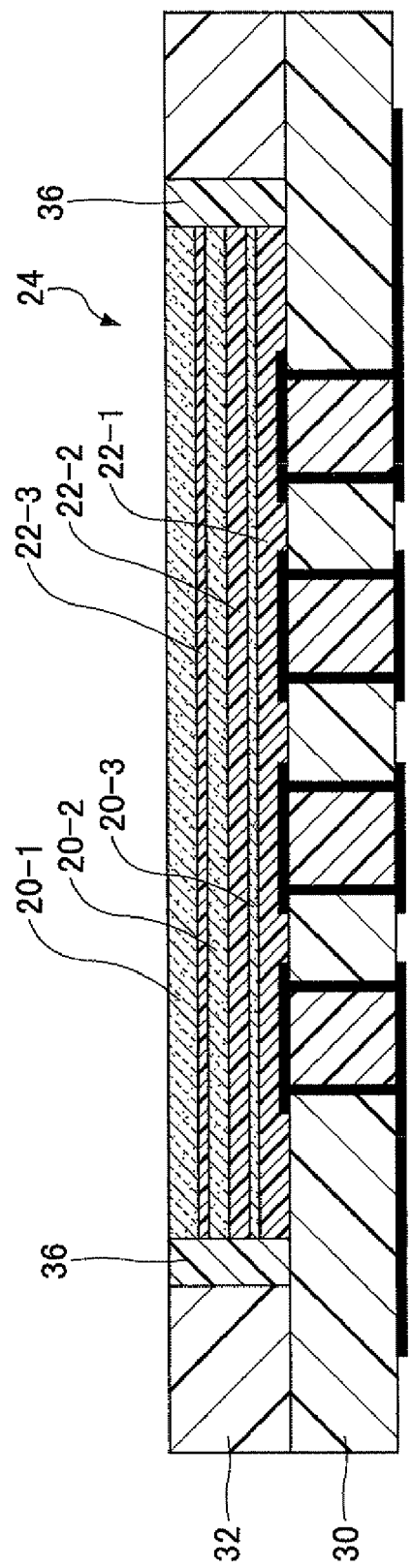
FIG. 9 is a cross-sectional view illustrating a state where a resin is filled into a gap between the lamination and an inner wall of a concave part.

Then, as illustrated in FIG. 9, gaps formed between the side surfaces of the lamination 24 of the silicon layers and the resin layers and the inner surfaces of the concave portion 32a are filled up with a resin 36. It is desirable that the resin 36 is the same resin as the resin layer 22-1, 22-2 and 22-3. The resin 36 is applied by a dispenser. After filling the resin 36, the resin 36 and the lamination 24 are heated simultaneously to cure the resin layers 22-1, 22-2 and 22-3 and also cure the resin 36. If the resin layers 22-1, 22-2 and 22-3 and the resin 36 are epoxy resin, the heating and curing temperature is, for example, 200° C. If resin layers 22-1, 22-2 and 22-3 and the resin 36 are polyimede resin, the heating and curing temperature is, for example, 350° C.

Figure 10:
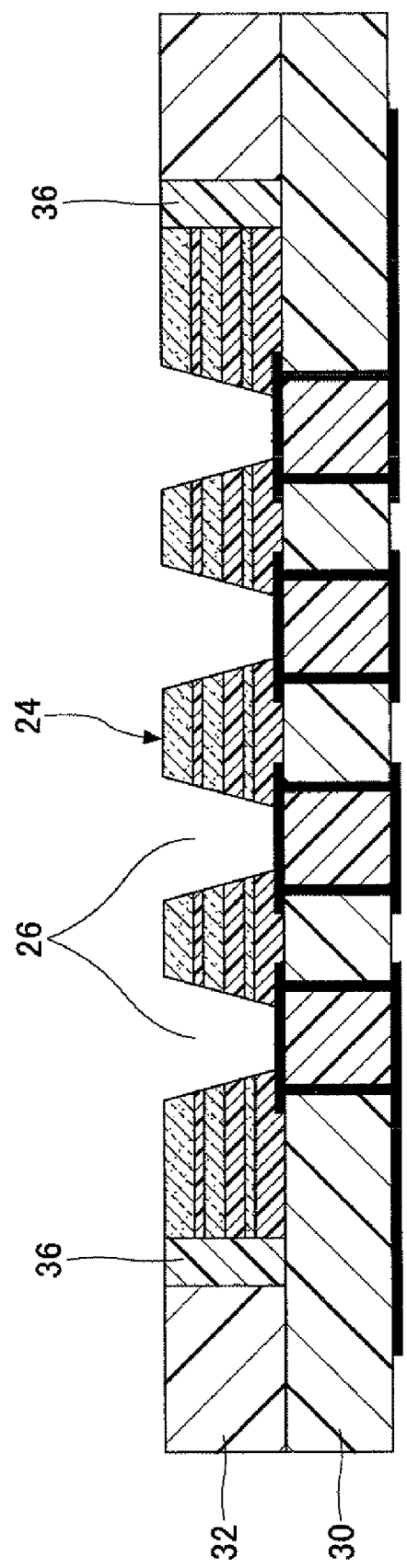
FIG. 10 is a cross-sectional view illustrating a state where holes are formed in the lamination.

After the resin layers 22-1, 22-2 and 22-3 and the resin 36 are cured, then, as illustrated in FIG. 10, the laminations 24 are processed by a laser to form a first hole 26 in each of the laminations 24. A YAG (yttrium aluminum garnet) laser can be used as a laser for processing the laminations 24. The first hole 26 is formed at a position corresponding to a Cu electrode formed on the surface of the glass cloth core 30 so that the Cu electrode is exposed on the bottom of the first hole 26. The first hole 26 is formed to electrically connect electrodes of the upper surface and the bottom surface of each printed wiring board 2.

Figure 11:
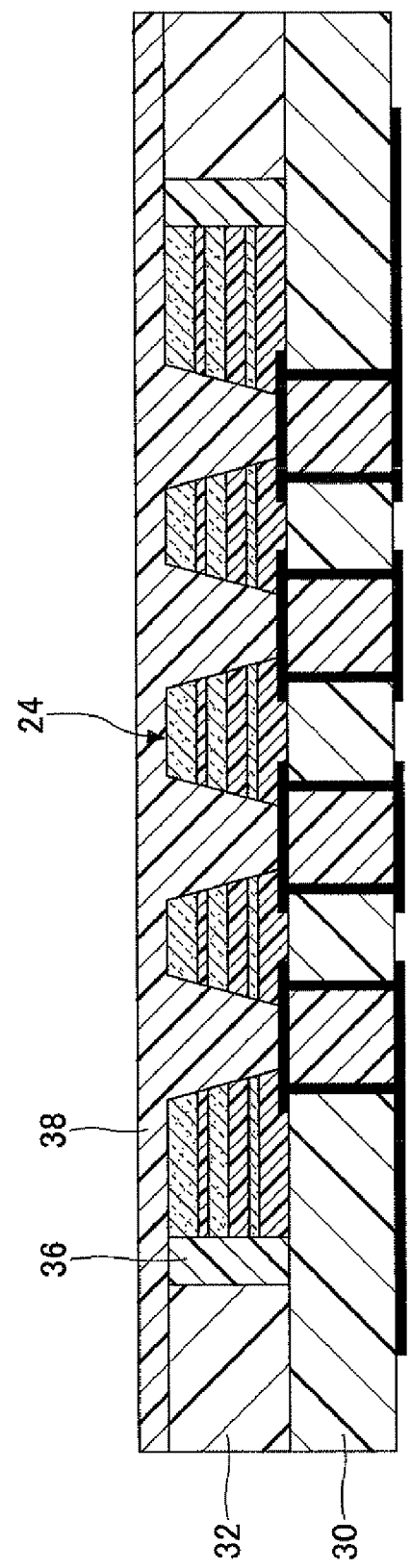
FIG. 11 is a cross-sectional view illustrating a state where the holes are filled by a resin.

Then, as illustrated in FIG. 11, a half-curable resin 38 is applied to the surfaces of the laminations 24, the resin 36 and the glass cloth core 32, and the half-curable resin 38 is cured. The flowability of the half-curable resin 38 is increased when it is being cured, and, thereby, the half-curable resin 38 is filled into the first holes 26. It is desirable that the half-curable resin 38 is an insulating resin and the same resin as the resin layers 22-1, 22-2 and 22-3.

Figure 12:
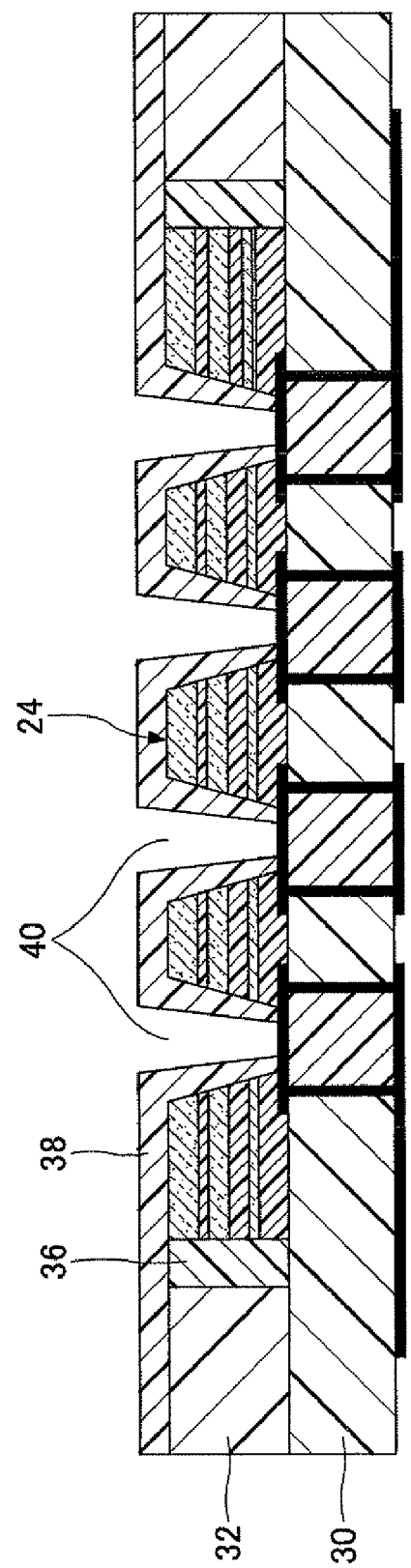
FIG. 12 is a cross-sectional view illustrating a state where holes are formed in parts filled by the resin.

Subsequently, as illustrated in FIG. 12, second holes 40 are formed in the half-curable resin 38, which has been filled and cured in the first holes 26 by laser processing. A YAG laser can be used as the laser for laser processing. A diameter of each of the second holes 40 must be smaller than a diameter of each of the first holes 26 so that an insulating portion is formed by the cured half-curable resin 38 remaining around each of the second holes 40.

Figure 13:
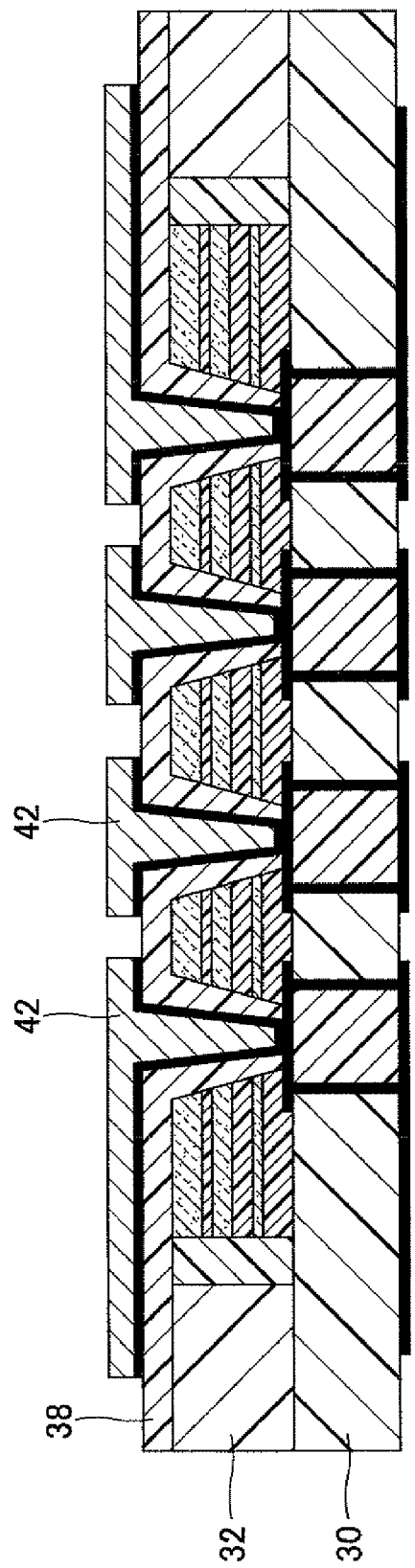
FIG. 13 is a cross-sectional view illustrating a state where a Cu plated layer is formed on an interior of the holes and surfaces of the resin.

Then, a seed layer is formed on the surface of the half-curable resin 38 and the inner surfaces of the holes 40, and the seed layer is formed into a predetermined pattern by resist-patterning. The formation of the seed layer is performed by electroless Cu plating or TiCu sputtering. Then, after forming a resist layer on the seed layer, the resist layer is subjected to patterning so that the seed layer is exposed as a predetermined wiring pattern. Subsequently, as illustrated in FIG. 13, electrolytic Cu plating is applied with the seed layer of the predetermined pattern used as a power supply layer in order to form a Cu plating layer 42. The Cu plating layer 42 is filled in the second holes 40 to form electrically conductive parts, which electrically connect the Cu wiring formed by the Cu plating layer 42 and the Cu wiring formed on the surface of the glass cloth core 30. Then, the resist is removed and the seed layer under the removed resist is removed by etching.

Here, the Cu plating layer formed on the inner surfaces of the second holes 40 is insulated from the laminations 24 by filling the half-curable resin 38 in the first holes 26 formed in the laminations 24 and forming the second holes in the half-curable resin 38. The reason for applying the insulation is that the silicon layers 20-1, 20-2, and 20-3 of each lamination 24 form a semiconductor, which may short-circuit the Cu plating layer of the first holes 26 when the Cu plating layer is formed on the inner surfaces of the first holes 26. That is, the resin remaining around the second holes 40 is caused to be an insulating layer by filling the resin in the first holes and forming the second holes 40 in the filled resin.

Figure 14:
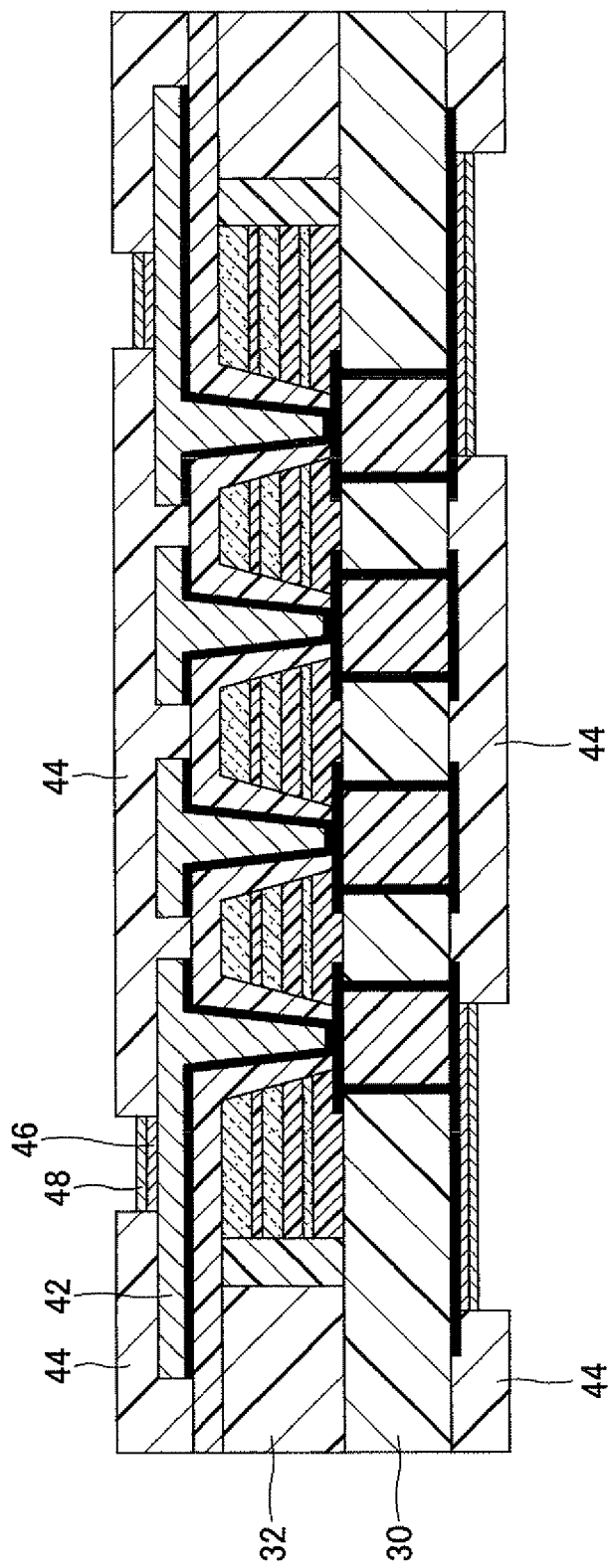
FIG. 14 is a cross-sectional view illustrating a state where a solder resist is formed.

After the resist is removed, then, as illustrated in FIG. 14, a solder resist 44 is applied on both sides of the printed wiring boards 2, and the solder resist 44 is removed at positions where external connection electrodes are provided. Then, nickel plating 46 is applied by an electroless plating method at portions where the Cu wiring is exposed by removing the solder resist 44. Then, gold plating 48 is applied by an electroless plating method on the nickel plating 46.

Figure 15:
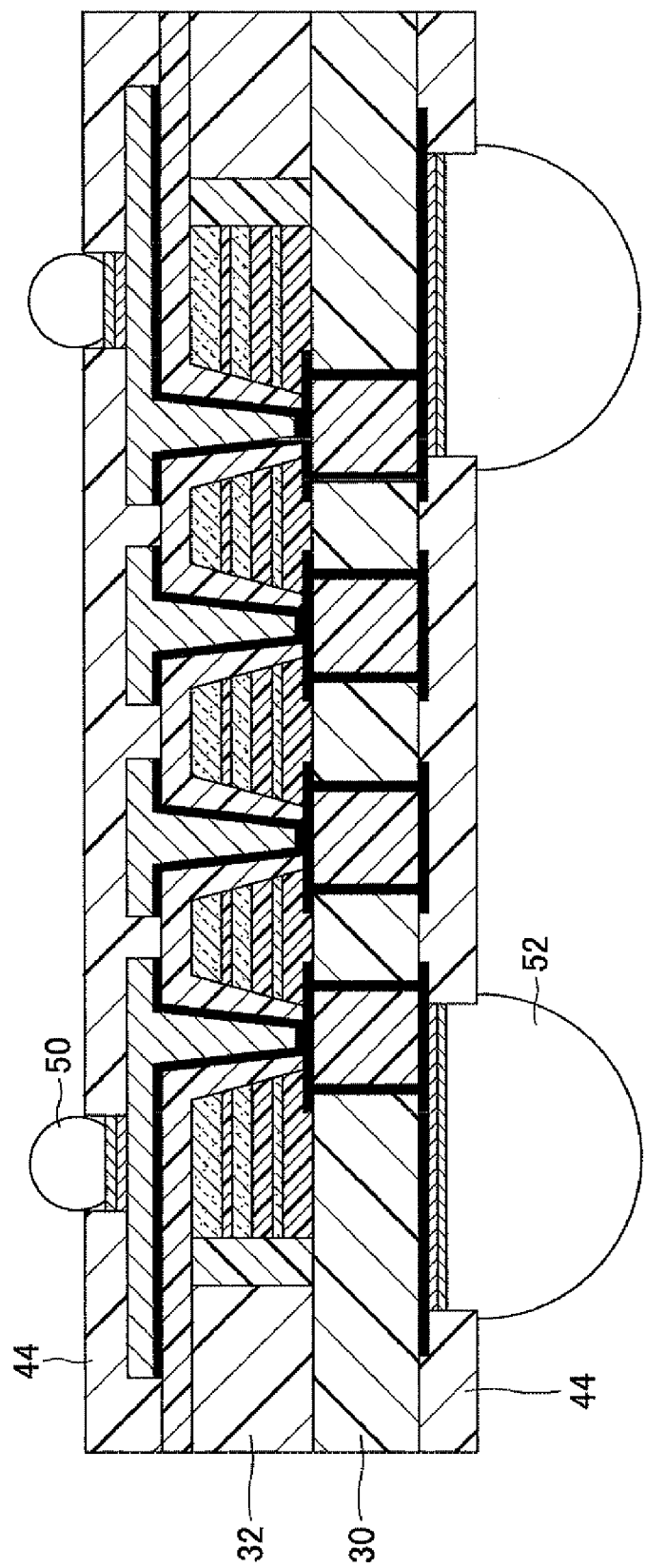
FIG. 15 is a cross-sectional view illustrating a state where solder bumps are formed.
Figure 16:
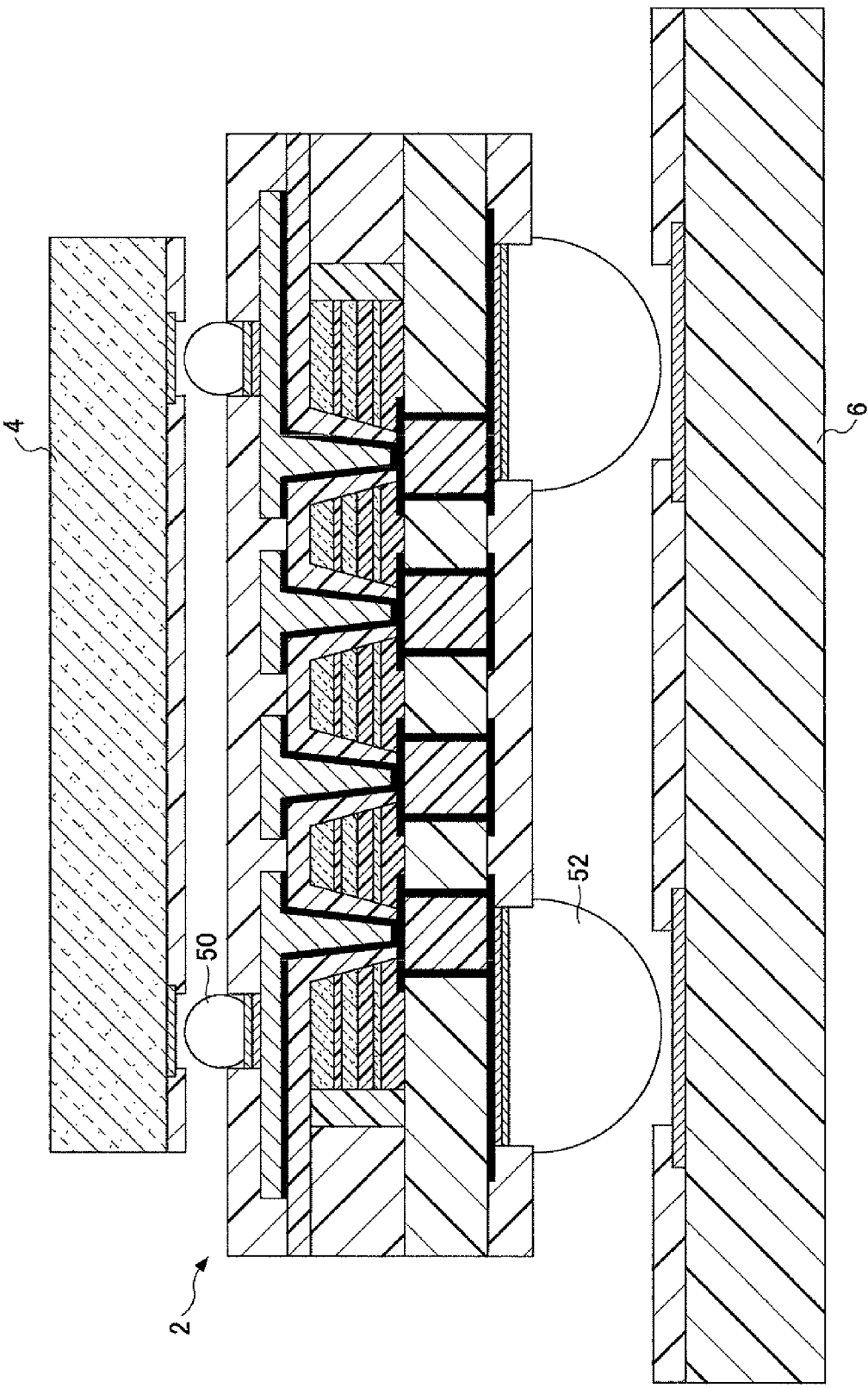
FIG. 16 is a cross-sectional view of a semiconductor chip, a printed wiring board and a build-up wiring board.

Then, as illustrated in FIG. 15, solder bumps 50 and 52 are formed in the portions where the nickel plating is exposed so that the solder bumps 50 and 52 serve as external connection electrodes. According to the above-mentioned processes, the printed wiring boards 2 are completed. As illustrated in FIG. 16, the solder bumps 50 are micro external connection electrodes to be connected to the electrodes of the semiconductor chip 4, and are arranged with a fine pitch. On the other hand, the solder bumps 52 are external connection electrodes to be connected to the electrodes of the build-up substrate such as a motherboard, and are formed with a size and a pitch of electrodes formed on a normal organic substrate.

It should be noted that the solder bumps 50 and 52 may not always be formed in the printed wiring board 2, and electrode wiring may be exposed from the solder resist 44. For example, the solder bumps 50 may be provided to the printed wiring board 2 or the semiconductor chip 4 when mounting the semiconductor chip 4 onto the printed wiring board 2. Similarly, the solder bumps 52 may be provided to the electrodes of the printed wiring board 2 or the build-up substrate 6 when mounting the printed wiring board 2 onto the organic substrate 6 such as, for example, a motherboard.

As mentioned above, after forming a plurality of printed wiring boards 2 on the glass cloth core 30, the glass cloth core 30 (including the glass cloth core 32) is finally cut along the double-dashed chain lines indicated in FIGS. 5, 6 and 8 to divide it into a plurality of individual printed wiring boards 2.

As mentioned above, the printed wiring board 2 according to the present embodiment has a lamination structure in which the silicon layers and the resin layers are alternately laminated, and, thus, the CTE is gradually changed in the interior of the printed wiring board 2. That is, the CTE in the interior of the printed substrate 2 is gradually changed from the CTE of the build-up substrate to the CTE of the semiconductor chip by forming the portion to be connected to the semiconductor chip by the same silicon as the semiconductor chip and by forming the portion to be connected to the build-up substrate (organic substrate 6) by the same resin as the resin material of the build-up substrate. Accordingly, a thermal stress, which is generated due to a difference in CTE between the semiconductor chip and the build-up substrate, is not generated in the connection part between the semiconductor chip and the printed wiring board 2 and the connection part between the build-up substrate and the printed wiring board 2, and the thermal stress is generated in the entire interior of the printed wiring board 2 and relaxed in the interior of the printed wiring board 2. Thus, no thermal stress is generated in the connection part between the semiconductor chip 4 and the wiring board 2 and the connection part between the organic substrate 6 and the printed wiring board 2. Thereby, the semiconductor device formed by mounting the semiconductor chip 4 onto the printed wiring board 2 is improved in its reliability, and the semiconductor device can clear a temperature cycle test. Moreover, a mounting reliability can be acquired when the semiconductor device formed by mounting the printed wiring board 2 onto the build-up substrate 6 (motherboard).

Moreover, each silicon layer used for the printed wiring board 2 is a small size, such as 10 mm×10 mm, and such small silicon layers are mounted on an organic substrate core material such as a glass cloth core to form the printed wiring board 2. Thus, many printed wiring boards can be manufactured collectively at once in a work size used in a manufacturing process of a normal organic substrate, which reduces the manufacturing cost of the printed wiring board 2 further than a manufacturing cost of a silicon interposer.

All examples and conditional language recited herein are intended for pedagogical purposes to aid the reader in understanding the principles of the invention and the concepts contributed by the inventor to furthering the art, and are to be construed a being without limitation to such specifically recited examples and conditions, nor does the organization of such examples in the specification relates to a showing of the superiority and inferiority of the invention. Although the embodiment(s) of the present invention(s) has(have) been described in detail, it should be understood that the various changes, substitutions, and alterations could be made hereto without departing from the spirit and scope of the invention.

What is claimed is:

1. A printed wiring board configured to be connected to an organic substrate in a state where a semiconductor chip is mounted on one surface of said printed wiring board and the other surface of said printed wiring board is connected to said organic substrate, the printed wiring board comprising:
   a plurality of first layers formed of a material having the same coefficient of thermal expansion as said semiconductor chip; and
   a plurality of second layers formed of a material having the same coefficient of thermal expansion as said organic substrate,
   wherein said first layers have different thicknesses from each other and said second layers have different thicknesses from each other;
   said first layers and said second layers form a lamination by being laminated alternately one layer on another layer;
   the thicknesses of said first layers decrease from a side where said semiconductor chip is mounted toward a side where said organic substrate is connected; and
   the thicknesses of said second layers decrease from the side where said organic substrate is connected toward the side where said semiconductor chip is mounted.

2. The printed wiring board as claimed in claim 1, wherein the lamination of said first layers and said second layers is formed on an organic substrate core material having electrode wirings formed on both sides thereof, and the electrode wirings formed on both sides of the organic substrate core material are connected to each other by a wiring part penetrating through the organic substrate core material.

3. The printed wiring board as claimed in claim 2, wherein said organic substrate core material includes a concave portion, said electrode wirings are formed on a bottom of the concave portion, and said lamination is formed in said concave portion.

4. The printed wiring board as claimed in claim 3, further comprising:
   an insulating part penetrating and extending through said lamination in a direction of a thickness of said lamination at a position corresponding to said electrode wirings of said organic substrate core material; and
   an electrically conductive part penetrating and extending through said insulating part in the direction of thickness of said lamination,
   wherein an end of the electrically conductive material is connected to wiring formed on a surface of said lamination via an insulating layer, and an opposite end of the electrically conductive material is connected to said electrode wirings of said organic substrate core material.

5. The printed wiring board as claimed in claim 1, wherein said first layers are formed of silicon, which also forms a substrate of said semiconductor chip, and said second layers are formed of a resin, which also forms said organic substrate core material.

* * * * *